(12) United States Patent
Hiramatsu et al.

(10) Patent No.: US 11,555,245 B2
(45) Date of Patent: Jan. 17, 2023

(54) METAL OXIDE FILM FORMATION METHOD

(71) Applicants: Toshiba Mitsubishi-Electric Industrial Systems Corporation, Chuo-ku (JP); Kyoto University, Kyoto (JP); Kochi Prefectural Public University Corporation, Kochi (JP)

(72) Inventors: Takahiro Hiramatsu, Tokyo (JP); Hiroyuki Orita, Tokyo (JP); Toshiyuki Kawaharamura, Kochi (JP); Shizuo Fujita, Kyoto (JP); Takayuki Uchida, Kyoto (JP)

(73) Assignees: Toshiba Mitsubishi-Electric Industrial Systems Corporation, Chuo-ku (JP); Kyoto University, Kyoto (JP); Kochi Prefectural Public University Corporation, Koch (JP)

( * ) Notice: Subject to any disclaimer, the term of this patent is extended or adjusted under 35 U.S.C. 154(b) by 387 days.

(21) Appl. No.: 15/737,138

(22) PCT Filed: Jun. 18, 2015

(86) PCT No.: PCT/JP2015/067535
§ 371 (c)(1),
(2) Date: Dec. 15, 2017

(87) PCT Pub. No.: WO2016/203594
PCT Pub. Date: Dec. 22, 2016

(65) Prior Publication Data
US 2018/0155837 A1    Jun. 7, 2018

(51) Int. Cl.
*C23C 16/455* (2006.01)
*C23C 16/44* (2006.01)
(Continued)

(52) U.S. Cl.
CPC .... *C23C 16/45574* (2013.01); *C23C 14/0021* (2013.01); *C23C 14/081* (2013.01);
(Continued)

(58) Field of Classification Search
CPC .............. C23C 16/45574; C23C 26/00; C23C 16/45514; C23C 16/448; C23C 14/0021;
(Continued)

(56) References Cited

U.S. PATENT DOCUMENTS 5,882,368 A * 3/1999 Falcony-Guajardo ...................... C03C 17/002
427/160
2005/0095480 A1* 5/2005 Beatty ................ B01D 67/0069
429/482

(Continued)

FOREIGN PATENT DOCUMENTS

JP    4-89378     3/1992
JP    5-152222    6/1993
(Continued)

OTHER PUBLICATIONS

International Search Report dated Jul. 28, 2015, in PCT/JP2015/067535 filed Jun. 18, 2015.
(Continued)

*Primary Examiner* — Michael B Cleveland
*Assistant Examiner* — Michael G Miller
(74) *Attorney, Agent, or Firm* — Oblon, McClelland, Maier & Neustadt, L.L.P.

(57) ABSTRACT

In a metal oxide film formation method of the present invention, the following steps are performed. In a solution vessel, a raw-material solution including aluminum as a metallic element is turned into a mist so that a raw-material solution mist is obtained. In a solution vessel provided independently of the solution vessel, a reaction aiding solu-
(Continued)

tion including a reaction aiding agent for formation of aluminum oxide is turned into a mist so that an aiding-agent mist is obtained. Then, the raw-material solution mist and the aiding-agent mist are fed to a nozzle provided in a reactor vessel via paths. Thereafter, the raw-material solution mist and the aiding-agent mist are mixed in the nozzle so that a mixed mist is obtained. Then, the mixed mist is fed onto a back surface of a heated P-type silicon substrate.

3 Claims, 4 Drawing Sheets

(51) Int. Cl.
    *C23C 14/00*     (2006.01)
    *C23C 14/08*     (2006.01)
    *C23C 26/00*     (2006.01)
    *C23C 16/448*     (2006.01)
    *H01L 31/0216*     (2014.01)
    *H01L 21/31*     (2006.01)
    *C23C 16/40*     (2006.01)

(52) U.S. Cl.
    CPC ............ *C23C 16/403* (2013.01); *C23C 16/44* (2013.01); *C23C 16/448* (2013.01); *C23C 16/45514* (2013.01); *C23C 26/00* (2013.01); *H01L 21/31* (2013.01); *H01L 31/02167* (2013.01); *Y02E 10/50* (2013.01)

(58) Field of Classification Search
    CPC ..... C23C 16/403; C23C 14/081; C23C 16/44; H01L 31/02167; H01L 21/31
    USPC ............................... 427/248.1–257, 162–169
    See application file for complete search history.

(56) References Cited

U.S. PATENT DOCUMENTS

| | | | |
|---|---|---|---|
| 2010/0102700 A1* | 4/2010 | Jaiswal | ................ B82Y 30/00 313/311 |
| 2012/0156372 A1 | 6/2012 | Birkmire et al. | |
| 2013/0039843 A1 | 2/2013 | Shirahata et al. | |

FOREIGN PATENT DOCUMENTS

| | | |
|---|---|---|
| JP | 9-195050 A | 7/1997 |
| JP | 10-273780 | 10/1998 |
| JP | 2007-528448 | 10/2007 |
| JP | 2008-78113 A | 4/2008 |
| JP | 2013-28480 | 2/2013 |
| JP | 2015-70248 A | 4/2015 |
| KR | 10-2013-0087560 | 8/2013 |
| KR | 10-2014-0012153 | 1/2014 |
| KR | 10-2015-0063789 | 6/2015 |
| WO | WO 2011/151889 A1 | 12/2011 |

OTHER PUBLICATIONS

Office Action dated Aug. 4, 2016, in Taiwanese Application 104126684 with Partial English Translation, 9 pages.
Kawaharamura, Toshiyuki et al., "Effect of $O_3$ and Aqueous Ammonia on Crystallization of MgO Thin Fim Grown by Mist Chemical Vapor Deposition", Japanese Journal of Applied Physics, vol. 52, No. 035501, (2013), pp. 1-5.
"Effects of source composition on electrical properties of ZnO transparent conductors by mist CVD method", The $70^{th}$ Extended Abstracts; The Japan Society of Applied Physics, vol. 1, (2009), p. 493, with partial English Translation.
Office Action dated Jul. 31, 2018 in Japanese Patent Application No. 2017-524222 with unedited computer generated English translation.
International Preliminary Report on Patentability and Written Opinion dated Dec. 28, 2017 in PCT/JP2015/067535 with English translation.
Office Action dated Nov. 20, 2018 in Japanese Patent Application No. 2017-524222, with English translation.
Combined Chinese Office Action and Search Report dated Jan. 24, 2019 in corresponding Chinese Patent Application No. 201580080986.0 (with English Translation), 13 pages.
Office Action dated Jun. 26, 2019 in corresponding Korean Application No. 10-2017-7035806, along with an English translation.
Chinese Office Action dated Sep. 27, 2019 in Chinese Patent Application No. 201580080986.0 (with English translation), 12 pages.

* cited by examiner

F I G . 7
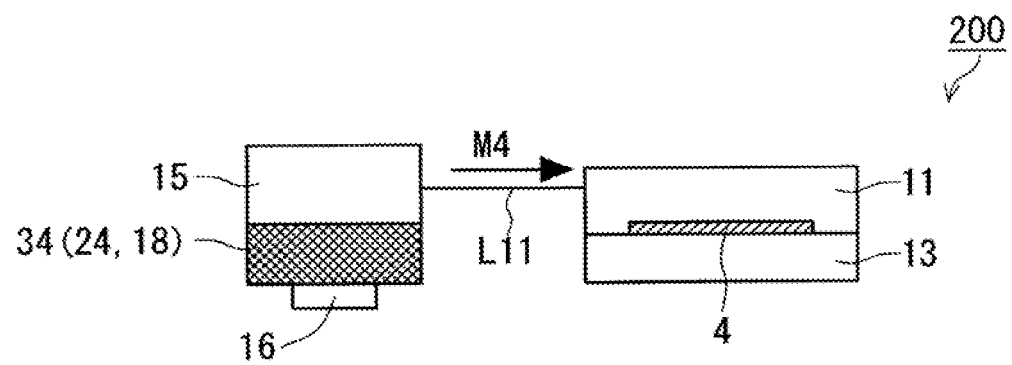

METAL OXIDE FILM FORMATION METHOD

TECHNICAL FIELD

The present invention relates to a metal oxide film formation method in which a metal oxide film is formed on a substrate using a mist method.

BACKGROUND ART

In the fields of a solar cell, a flat panel display (FFD), a light emitting device such as a light emitting diode (LED), a touch panel, and the like, a metal oxide film is formed on a substrate. As a method of forming a metal oxide film on a substrate by using a non-vacuum film formation technique, a metal oxide film formation method in which a solution is opened to air, such as a spray method, a sol-gel method, or a mist chemical vapor deposition (CVD) method, is conventionally employed.

In each of those film formation methods, when a metal oxide film which is an object being formed is formed, one kind of raw-material solution is used. While it is possible to perform blending for a raw-material solution beforehand, one kind of blended raw-material solution is supposed to be used in forming a metal oxide film.

As such, in a metal oxide film formation method using a conventional non-vacuum film formation technique, because of the use of one kind of blended raw-material solution in forming, a metal oxide film, reaction energy required to form a metal oxide film with a raw-material solution is uniquely determined.

As a method which lowers reaction energy in forming a metal oxide film with a raw-material solution to increase a speed of forming a metal oxide film, there are two conventional methods as follows.

First, as a first method in which a process is performed in a direct manner, a method in which a reaction aiding agent is previously mixed into a raw-material solution, to lower the above-described reaction energy, is conceivable. As an example of the first method, a metal oxide film formation method disclosed in Patent Document 1 is cited, for example.

FIG. 7 is an explanatory view showing an overall configuration of a conventional film forming apparatus 200 using the first method, which is disclosed in Patent Document 1.

As shown in FIG. 7, a raw-material solution 18 (a solution including zinc) and a reaction aiding solution 24 (ammonia water) in the same solution vessel 15 are fed, and a mixed solution 34 of the raw-material solution 18 and the reaction aiding solution 24 is turned into a mist by a mist former 16, so that a mixed mist M4 which is the mixed solution 34 turned into a mist is obtained.

Then, the mixed mist M4 passes through a path L11 and is fed to a back surface (upper surface) of a P-type silicon substrate 4 in a reactor vessel 11, so that a back-side passivation film 5 (zinc oxide thin film) is formed on a back surface of the P-type silicon substrate 4.

According to the film formation method disclosed in Patent Document 1, in forming a metal oxide film (zinc oxide thin film) using a mist method, the raw-material solution 18 and the reaction aiding solution 24 including a reaction aiding agent (ammonia water) are mixed with each other in the same atomizer (the solution vessel 15, the mist former 16), so that the mixed mist M4 is obtained. Then, the mixed mist M4 is fed to a back surface (one main surface) of the P-type silicon substrate 4 in the reactor vessel 11, in an attempt to lower the above-described reaction energy.

On the other hand, a second method in which a process is performed in an indirect manner is a method in which a reaction aiding gas is additionally fed to the above-described reactor vessel to adjust an atmosphere at a time of formation of a metal oxide film, so that lowering of the above-described reaction energy at a time of formation of a metal oxide film can be achieved by a raw-material solution turned into a mist in the above-described reactor vessel, and a high-quality metal oxide film is attained.

PRIOR ART DOCUMENTS

Patent Documents

Patent Document 1: Pamphlet of International Publication No. WO 2011/151889

SUMMARY OF INVENTION

Problems to be Solved by the Invention

However, according to the above-described first method, a mixed mist is obtained by mixture in the same atomizer, and so, the raw -material solution 18 and the reaction aiding solution 24 are placed under circumstances where those solutions are reacting with each other at all times (in an atomizer). Hence, as a time of reaction between a front electrode 1 and the reaction aiding solution 24 becomes longer, a property of the mixed mist M4 is degraded from a desired property. As a result, there is caused a problem of being unable to form a metal oxide film having excellent film quality. For example, instability of the mixed mist M4 as a raw material, generation of a reaction product which is unnecessary for formation of a metal oxide film in the mixed mist M4, or the life is caused, which makes it difficult to enhance quality of a metal oxide film or to achieve film formation which is reproducible and stable.

Also, in the second method, a reaction aiding gas which is fed to a reactor vessel is in gaseous form, so that reaction is promoted by a reaction aiding gas more weakly than in the first method. This causes a problem of increasing a possibility of reduction in reaction speed or reduction in film quality of a metal oxide film due to non-uniform distribution in a film.

The present invention has been made in order to solve the above-described problems, and it is an object of the present invention to attain a metal oxide film formation method which can obtain a high-quality metal oxide film while enhancing production efficiency.

Means for Solving the Problems

A metal oxide film formation method according to the present invention includes the steps of: (a) using a raw-material solution including a metallic element into a mist, to obtain a raw-material solution mist, in a first vessel; (b) turning a reaction aiding solution including a reaction aiding agent for the metallic element into a mist, to obtain an aiding-agent mist, in a second vessel provided independently of the first vessel; and (c) feeding the raw-material solution mist and the aiding-agent mist obtained via first and second paths provided independently of each other, into a reactor vessel while heating a substrate placed in the reactor vessel, to form a-metal oxide film including the metallic element on one main surface of the substrate.

Effects of the Invention

In the metal oxide film formation method according to the present invention, mixed mist is obtained by mixture of the raw-material solution mist and the aiding-agent mist in the reactor vessel when the step (c) is performed, so that a film formation speed of a metal oxide film including a metallic element can be improved, and production efficiency can be improved.

Also, the raw-material solution mist and the aiding-agent mist are individually obtained in the first and second vessels, respectively, which are provided independently of each other when she step (a) and the step (b) are performed, and so, the raw-material solution mist and the aiding-agent mist react with each other for the first time in the reactor vessel. Accordingly, a phenomenon its which the raw-material solution mist and the aiding-agent mist unnecessarily react with each, other before the step (c) is performed is surely a voided, so that film quality of a metal oxide film can be improved.

These and other objects, features, aspects and advantages of the present invention will become more apparent from the following detailed description of she present invention when taken in conjunction with the accompanying drawings.

BRIEF DESCRIPTION OF DRAWINGS

FIG. 7 is an explanatory view showing an overall configuration of a conventional film forming apparatus.

DESCRIPTION OF EMBODIMENTS

<Basic Art (Structure of Solar Cell)>

Figure 6:
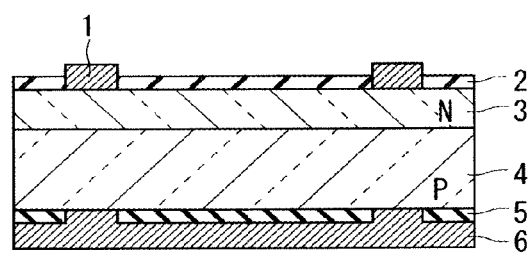
FIG. 6 is a cross-sectional view showing a structure of a solar cell which is manufactured using a manufacturing method for a back-side passivation film according to embodiments of the present invention.

FIG. 6 is a cross-sectional view showing a structure of a solar cell which is manufactured by a manufacturing method for a metal, oxide film according to embodiments (first embodiment and second embodiment).

As shown in FIG. 6, on a front surface (the other main surface) of a silicon substrate 4 having a P-type conductivity (which will hereinafter be referred to as a "P-type silicon substrate 4"), a silicon layer 3 having an N-type conductivity (which will hereinafter be referred to as an "N-type silicon layer 3") is formed. It is noted that FIG. 6 shows the P-type silicon substrate 4 in such a manner that a front surface is an upper surface and a back-surface is a lower surface.

Also, a front-side passivation film 2 which has transparency is formed in a front surface of the N-type silicon layer 3. Then, a front electrode 1 is formed selectively on a front surface of the N-type silicon layer 3 so as to penetrate a part of the front-side passivation film 2, so that the front electrode 1 is electrically connected to the N-type silicon layer 3.

Further, a back-side passivation, film 5 (metal oxide film) is formed on a back surface (one main surface) of the P-type silicon substrate 4. As the back-side passivation film 5, an aluminum oxide film (an $Al_2O_3$ thin film) or a laminated film of an aluminum oxide film and a silicon nitride film is employed. Then, a back electrode 6 is formed directly on a back surface of the P-type silicon -substrate 4 so as to penetrate a part of the back-side passivation film 5 and lie over a back surface of the back-side passivation film 5. Accordingly, the back electrode 6 is electrically connected to the P-type silicon substrate 4.

In the structure of the solar cell shown in FIG. 6, light is incident upon the front-side passivation film 2 and reaches PN junction between the N-type silicon layer 3 and the P-type silicon substrate 4, so that carriers are generated, resulting in generation of electricity, which is then taken out from the electrodes 1 and 6.

The passivation films 2 and 5 are formed in order to suppress reduction in a lifetime of carrier. More specifically, many defects (such as lattice defects) occur in a front surface of the N-type silicon layer 3 or a back surface of the P-type silicon substrate 4, and minority carriers which occur due to light irradiation through the defects are re-combined. Thus, by forming the front-side passivation film 2 and the back-side passivation film 5 on a front surface of the N-type silicon layer 3 and a back surface of the P-type silicon substrate 4, respectively, it is possible to suppress re-combination of carriers and improve a lifetime of carrier, as a consequence.

The present invention relates to improvement in production efficiency and improvement in film quality of the back-side passivation film 5 which is a metal oxide film formed oh a back surface Cone main surface) of the P-type silicon substrate 4 (substrate), and is utilized in a manufacturing method for a solar cell, or the like. Below, the present invention will be specifically described with reference to the drawings which show embodiments of the present invention.

First Embodiment

Figure 1:
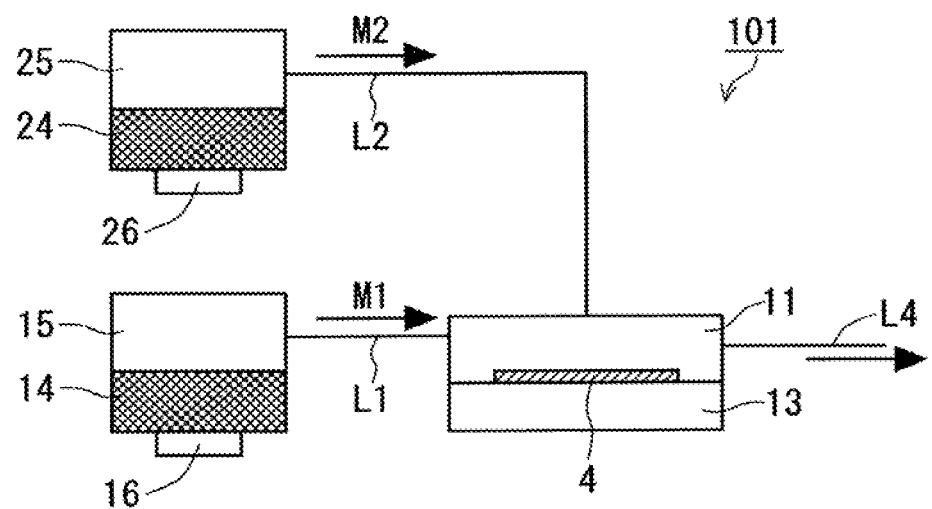
FIG. 1 is an explanatory view showing an overall configuration of a film forming apparatus for implementing a film formation method for a back-side passivation film, according to a first embodiment of the present invention.

FIG. 1 is an explanatory view showing an overall configuration of a film forming apparatus for implementing a film formation method for the hack-side passivation film 5 (metal oxide film), according to a first embodiment of the present invention.

As shown in FIG. 1, a film forming apparatus 101 used in the film formation method according to the present embodiment includes a reactor vessel 11, a heating instrument 13 which heats the reactor vessel 11, a solution vessel 15 which contains a raw-material solution 14, a mist former 16 which turns the raw-material solution 14 in the solution vessel 15 into a mist, a solution vessel 25 which contains a reaction aiding solution 24 including a reaction aiding agent, and a mist former 26 which turns the reaction aiding solution 24 in the solution into a mist. It is noted that a reaction aiding agent is used for the purpose of promoting reaction in a film formation process for the back-side passivation film 5 (metal oxide film) using a mist method.

In this configuration, a raw-material solution mist M1 which is the raw-material solution 14 turned into a mist by the mist former 16 is fed to the reactor vessel 11 via a path L1 (first path). On the other hand, an aiding-agent mist M2 which is the reaction aiding solution 24 turned into a mist by the mist former 26 is fed to the reactor vessel 11 via a path L2 (second path) which is provided independently of the path L1.

The raw-material solution mist M1 and the aiding-agent mist M2 which are fed to the reactor vessel 11 via the paths L1 and L2 are sprayed as a mixed mist M3 obtained by mixture in the reactor vessel 11, onto a back surface of the P-type silicon substrate 4 placed in the reactor vessel 11, so that the back-side passivation film 5 composed of an aluminum oxide film can be formed on a back surface of the P-type silicon substrate 4. At that time, the P-type silicon substrate 4 is placed on the heating instalment 13 in the reactor vessel 11 in such a manner that a back surface is an upper surface and a front surface is a lower surface.

That is, with the P-type silicon substrate 4 being placed on the heating instrument 13, the mixed mist M3 (a mixed solution of the raw-material solution 14 and the reaction aiding solution 24, which is in the form of liquid droplets each having a small diameter) is fed into the reactor vessel 11 under an atmospheric pressure, and the back-side passivation film 5 is formed on a back surface of the P-type silicon substrate 4 through predetermined reaction.

The heating instrument 13 is a heater or the like, and can heat the P-type silicon substrate 4 placed on the heating instrument 13. During film formation, the heating instrument 13 is heated to a temperature required to form the back-side passivation film 5 composed of an aluminum oxide film, by an external controller not shown.

The solution vessel 15 is filled with the raw-material solution 14 which is a material solution for forming the back-side passivation film 5. The raw-material solution 14 is a material solution including an aluminum (Al) element as a metallic element.

As the mist former 16, an ultrasonic atomizer can be employed, for example. The mist former 16 which is an ultrasonic atomizer applies art ultrasonic wave to the raw-material solution 14 in the solution vessel 15, to thereby turn the raw-material solution 14 in the solution, vessel 15 into a mist. The raw-material solution mist M1 which is the raw-material solution 14 turned into a mist is fed to the reactor vessel 11 via the path L1.

The solution vessel 25 is filled with the reaction aiding solution 24 for an aluminum element. The reaction aiding solution 24 is composed of ammonia water ($NH_3$).

The mist former 26 which has the same function as the mist former 16 applies an ultrasonic wave to the reaction aiding solution 24 in the solution vessel 25, to thereby turn the reaction aiding solution 24 in the solution vessel 25 into a mist. The aiding-agent mist M2 which is the react ion aiding solution 24 turned into a mist is fed to the reactor vessel 11 via the path L2.

Figure 2:
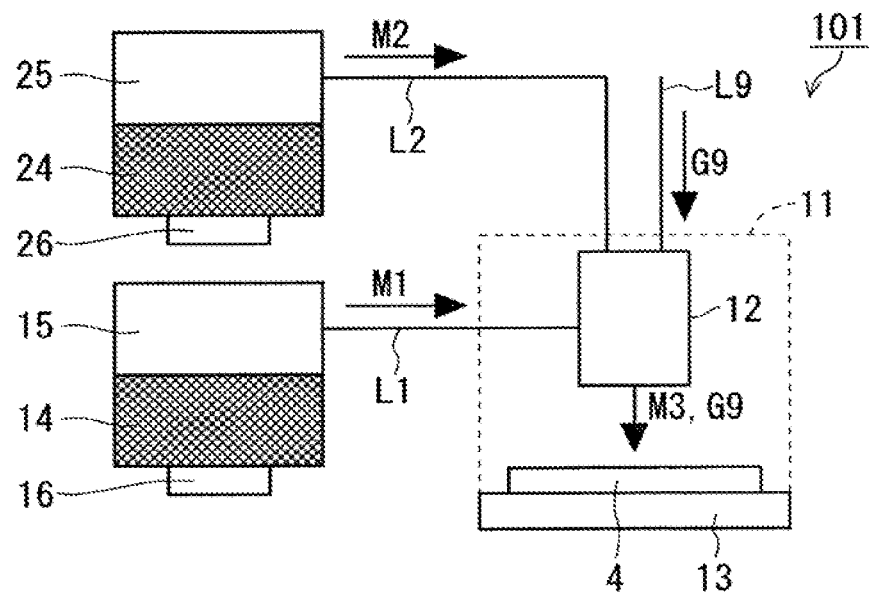
FIG. 2 is an explanatory view specifically showing a reactor vessel of the film forming apparatus shown in FIG. 1, and its surroundings.

FIG. 2 is an explanatory view specifically showing the reactor vessel 11 of the film forming apparatus 101 according to the first embodiment, and its surroundings.

When the raw-material solution mist Ml and the aiding-agent mist M2 are fed to a (film forming) nozzle 32 in the reactor vessel 11 via the paths L1 and L2 different from each other, respectively, the raw-material solution mist M1 and the aiding-agent mist M2 are mixed with each other in the nozzle 12, and the mixed mist M3 is fed onto an upper surface of the P-type silicon substrate 4 from the nozzle 12.

As a result of this, the mixed mist M3 reacts on a back surface of the P-type silicon substrate 4 which is being heated and is placed under an atmospheric pressure, so that the back-side passivation film 5 is fonfned on a back surface of the P-type silicon substrate 4. Further, an ozone gas G9 is fed to the nozzle 12 via a path L9. Accordingly, the ozone gas G9, in addition to the mixed mist M3, is fed onto a back surface of the P-type silicon substrate 4 from the nozzle 12. The ozone gas G9 is used for promoting reaction of the mixed mist Ml In other words, the ozone gas G9 is used as a reaction aiding gas which is used in the conventional second method in which a process is performed in an indirect manner.

(Manufacturing Method)

Next, a film formation method for the back-side passivation film 5 (aluminum oxide film) according to the first embodiment will be described.

First, a predetermined impurity is introduced into a silicon substrate using crystalline silicon as a composing material, so that the P-type silicon substrate 4 having a P-type conductivity is formed. Subsequently, the P-type silicon substrate 4 is placed on the heating instrument 13 in the reactor vessel 11. At that time, the P-type silicon substrate 4 is placed on the heating instrument 13 in such a manner that a back surface thereof is an upper surface and a front surface thereof is a lower surface, and a pressure in the reactor vessel 11 is set at an atmospheric pressure.

Then, the heating instrument 13 heats the P-type silicon substrate 4 placed on the heating instrument 13, to a film formation temperature for the back-side passivation film 5 composed of an aluminum oxide film, and a temperature of the P-type silicon substrate 4 is kept at the film formation temperature.

In the meantime, in the solution vessel 15, the raw-material solution 14 is turned into a mist by the mist former 16, so that the raw-material solution mist M1 is obtained. The raw-material solution mist M1 (the raw-material solution 14 in the form of liquid droplets each having a small diameter) passes through the path L1, is rectified, and is led into the reactor vessel 11. In this regard, the raw-material solution 14 includes aluminum as a metal source.

As described above, in the solution vessel 15 (first vessel), the raw-material solution 14 including aluminium which is a metallic element is turned into a mist, so that the raw-material solution mist M1 is obtained.

On the other hand, in the solution vessel 25, the reaction aiding solution 24 is turned into a mist by the mist former 26, so that the aiding-agent mist M2 is obtained. The aiding-agent mist M2 (the reaction aiding solution 24 in the form of liquid droplets each having a small diameter) passes through the path L2, is rectified, and is fed into the reactor vessel 11. In this regard, ammonia water is used as the reaction aiding solution 24.

Thus, to obtain the aiding-agent mist M2, the reaction aiding solution 24 including a reaction aiding agent used for formation of aluminum oxide is turned into a mist in the solution vessel 25 (second vessel) which is provided independently of the solution vessel 15.

Subsequently, the raw-material solution mist M1 and the aiding-agent mist M2 are fed to the nozzle 12 provided in the reactor vessel 11 via the paths L1 and L2 (first and second paths). Thereafter, the raw-material solution mist M1 and the aiding-agent. mist M2 are mixed with each other in the nozzle 12, so that the mixed mist M3 is obtained. Then, the mixed mist M3 is fed onto a back surface (one main surface) of the P-type silicon substrate 4 being heated. Further, also the ozone gas G9 is fed onto a back surface of the P-type silicon substrate 4 from the nozzle 12.

Thus, by spraying the mixed mist M3 to a back surface of the P-type silicon substrate 4 being heated under an atmospheric pressure, it is possible to form the back-side passivation film 5 composed of aluminum oxide which is a metal oxide film, on a back surface of the P-type silicon substrate 4.

Further, by lowering reaction energy required for film formation for the back-side passivation film 5 by virtue of the use of the aiding-agent mist M2 included in the mixed mist M3, it is possible to form the back-side passivation film 5 at a relatively low temperature. Moreover, also the ozone gas G9 is fed onto a back surface of the P-type silicon substrate 4, so that decomposition and oxidation of a material compound of the mixed mist M3 can be promoted.

After that, the structure of the solar cell shown in FIG. 6 is manufactured with the use of the P-type silicon substrate 4 in which the back-side passivation film 5 is formed. It is general that the back-side passivation film 5 is formed after formation of the front-side passivation film 2 and the N-type silicon layer 3, and thereafter the front electrode 1 and the back electrode 6 are formed. It is noted that the front-side passivation film 2 and the back-side passivation film 5 may be formed in a reverse order.

Figure 3:
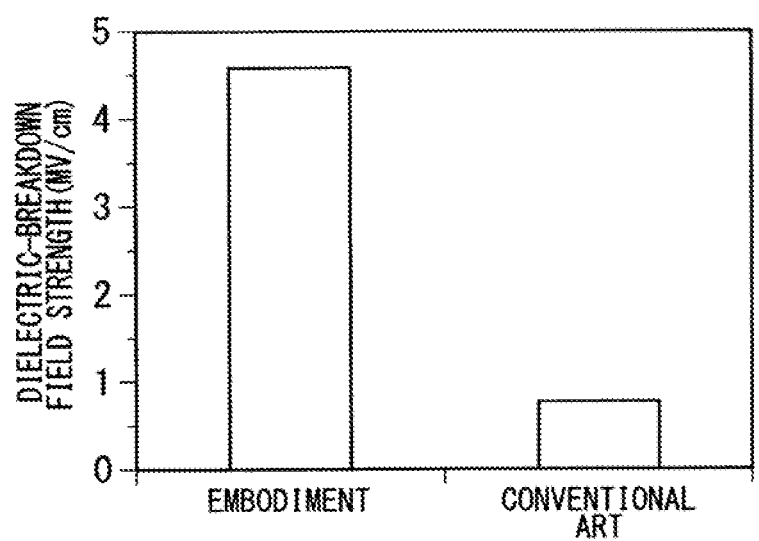
FIG. 3 is a graph showing effects produced by the film formation method for a back- side passivation film according to the first embodiment.

FIG. 3 is a graph showing effects produced by the film formation method for the back-side passivation film 5 according to the first embodiment. FIG. 3 shows respective dielectric-breakdown field strengths (MV/cm) of the back-side passivation films 5 which are formed by the manufacturing method according to the first embodiment and the conventional first method shown in FIG. 7, respectively.

As shown in FIG. 3, it is clear that a dielectric-breakdown field strength of the back-side passivation film 5 which is formed by the film formation method according to the first embodiment is improved significantly (appropriately fivefold), as compared to a dielectric-breakdown field strength of the back-side passivation film 5 which is formed by the conventional film formation method.

As such, in the film formation method for the back-side passivation film 5 (metal oxide film) in the manufacturing method for a solar cell according to the first embodiment, the back-side passivation film 5 is formed on a back surface of the P-type silicon substrate 4 by a mist method (more specifically, by a film formation process of spraying the mixed mist M3 under an atmospheric pressure).

As described above, in the film formation method for the back-side passivation film 5 according to the first embodiment, circumstances under which the mixed mist M3 can be obtained by mixture of the raw-material solution mist M1 and the aiding-agent mist M2 are provided in the reactor vessel 11, so that a film formation speed of the back-side passivation film 5 can be increased and thus, production efficiency can be improved.

Also, reaction energy for formation of the back-side passivation film 5 can be lowered by virtue of the use of the mixed mist M3 including the aiding-agent mist M2, so that the back-side passivation, film 5 can be formed at a lower temperature than that in a case where film formation is performed by using only the raw-material solution mist M1.

Further, the raw-material solution mist M1 and the aiding-agent mist M2 are mixed in the nozzle 12 for film formation, and the mixed mist M3 can be surely fed onto a back surface of the P-type silicon substrate 4, so that production efficiency of the back-side passivation film 5 can be surely improved.

At that time, the raw-material solution mist M1 and the aiding-agent mist M2 are individually obtained in the solution vessel 15 and the solution vessel 25, respectively, which are provided independently of each other, the raw-material solution mist M1 and the aiding-agent mist M2 react with each other for the first time in the reactor vessel 11. This prevents occurrence of a reaction product of the raw-material solution must M1 and the aiding-agent mist M2, which hinders formation of the back-side passivation film 5 in the course of feeding of the raw-material solution mist M1 and the aiding-agent mist M2 in the solution vessel 15 and the solution vessel 25, or via the paths L1 and L2.

Accordingly, a phenomenon in which the raw-material solution mist M1 and the aiding-agent mist M2 unnecessarily react with each other before a film formation step for the back-side passivation film 5 is performed in the reactor vessel 11 can be surely avoided, so that film quality of the back-side passivation film 5 can be improved as shown in FIG. 3.

Also, the mixed mist M3 has a density which is 1-600 times as high as that of a gas, so that an atmosphere having a density which is 1000 times as high as that of a gaseous aiding agent used in the conventional second method can be provided as an atmosphere in the reactor vessel 11. Thus, the back-side passivation film 5 which has higher quality than a film manufactured by the conventional second method can be manufactured even in a state in which an object is heated at a low temperature.

It is noted that in the first embodiment, by further feeding the ozone gas G9 serving as a reaction aiding gas into the reactor vessel 11 as shown in FIG. 2, it is possible to promote decomposition and oxidation of a material compound of the mixed mist M3. This effect of promotion allows the back-side passivation film 5 to be formed on a back surface of the P-type silicon substrate 4 even in a state in which an object is heated at a low temperature.

The above-described effect regarding film quality of a metal oxide film (the back-side passivation film 5) becomes particularly noticeable in a case where a metallic element included in the raw-material solution 14 is aluminum and the back-side passivation film 5 composed of aluminum oxide is formed.

Further, in a case where the back-side passivation film 5 composed of aluminum oxide is formed, it is preferable that the above-described ammonia water, or a solution including, a hydrochloric acid in place of ammonia water, is used as the reaction aiding solution 24.

<Problems in the First Embodiment>

The above-described first embodiment provides a method in which: the raw-material solution 14 and the reaction aiding solution 24 are turned into mists in the solution vessel 15 and the solution vessel 25 which are separate from each other, respectively; the raw-material solution mist M1 and the aiding-agent mist M2 which are generated are fed to the nozzle 13 provided in the reactor vessel 11 via the paths L1 and L2 different from each other, respectively; and the back-side passivation, film 5 is formed after the mixed mist M3 is obtained in the nozzle 12.

However, the raw-material solution mist M1 and the aiding-agent mist M2 may be mixed with low efficiency by mixture of the raw-material solution mist M1 and the aiding-agent mist M2 in the nozzle 12 provided in the reactor vessel 11, so that the mixed mist M3 may possibly be placed in a state in which the mixed mist M3 does not have a desired property because of unsatisfactory mixture. Thus, in a case where the back-side passivation film 5 is formed using the mixed mist M3 which is obtained in the nozzle 12, there may remain a problem of being unable to surely obtain the back-side passivation film 5 having high quality To solve the above-described problem, a film formation method for the back-side passivation film 5 according to a second embodiment as follows is conceived.

Second Embodiment

Figure 4:
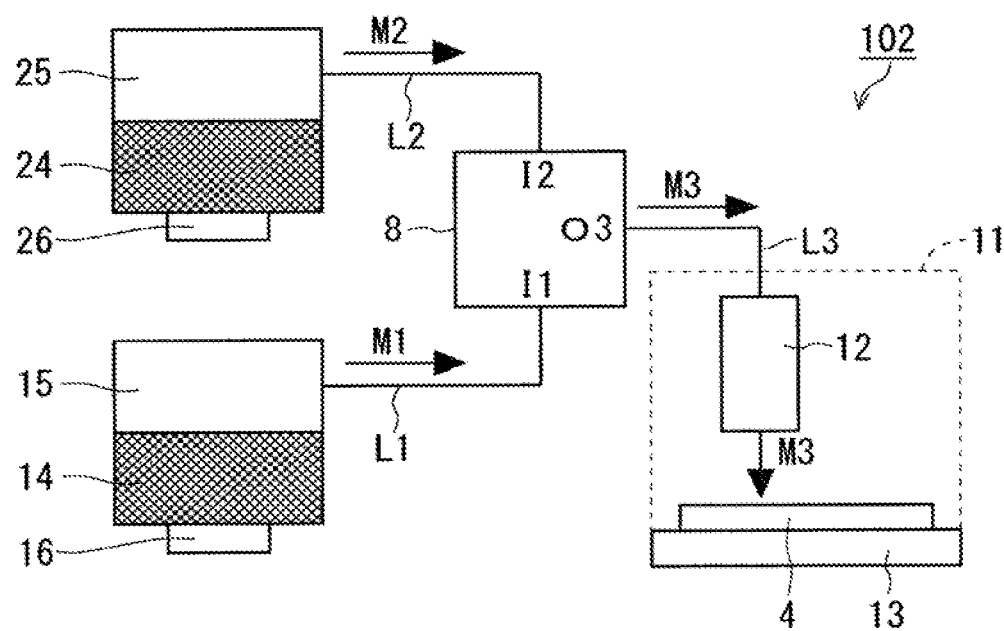
FIG. 4 is an explanatory view showing an overall configuration of a film forming apparatus for implementing a film formation method for a back-side passivation film 5 according to a second embodiment of the present invention.

FIG. 4 is an explanatory view showing an overall configuration of a film forming apparatus for implementing a film formation method for the back-side passivation film 5, according to a second embodiment of the present invention. Below, components which are different from those in the first embodiment will be chiefly described while description of components which are similar to those in the film forming apparatus 101 of the first embodiment shown in FIGS. 1 and 2 will be omitted as appropriate.

As shown in FIG. 4, a feature of a film forming apparatus 102 used in the film formation method according to the present embodiment lies in provision of a mixing vessel 8 between the paths L1 and L2 and the reactor vessel 11. More specifically, the mixing vessel 8 includes two input sections I1 and I2 and one output section O3, and the input section I1 is connected to the path L1, the input section I2 is connected to the path L2, the output section O3 is connected to a path L3 (third path), and the path L3 is connected to the nozzle 12 in the reactor vessel 11.

In the configuration shown in FIG. 4, the raw-material solution mist M1 and the aiding-agent mist M2 are fed to the mixing vessel 8 via the paths L1 and L2. The raw-material solution mist M1 and the aiding-agent mist M2 are mixed in the mixing vessel 8 and are fed, as the mixed mist M3, to the nozzle 12 in the reactor vessel 11 via the path L3, and the mixed mist M3 is fed onto a back surface of the P-type silicon substrate 4 from the nozzle 12.

Accordingly, with the P-type silicon substrate 4 being placed on the heating instrument 13, the mixed mist M3 is fed from the nozzle 12 into the reactor vessel 11 placed tinder an atmospheric pressure, and the back-side passivation film 5 is formed on a back surface of the P-type silicon substrate 4 through predetermined reaction, in the same manner as in the first embodiment.

As a result of this, the mixed mist M3 reacts on a back surface of the P-type silicon substrate 4 which is being heated and is placed under an atmospheric pressure, so that the back-side passivation film 5 is formed on a back surface of the P-type silicon substrate 4.

(Manufacturing Method)

Next, the film formation method for the back-side passivation film 5 (aluminum oxide film) according to the second embodiment will be described. It is noted that description of tire same processes in the method as those in the first embodiment will be omitted as appropriate.

First, in the same manner as in the first embodiment, the P-type silicon substrate 4 is placed on the heating instrument 13 in the reactor vessel 11.

Subsequently, the heating instrument 13 heats the P-type silicon substrate 4 placed on the heating instrument 13 to a film formation temperature for the back-side passivation film 5 composed of an aluminum oxide film, and a temperature of the P-type silicon substrate 4 is kept at the film formation temperature.

In the meantime, in the same manner as in the first embodiment, performed are a step of obtaining the raw-material solution mist (M1) by turning the raw-material solution 14 into a mist (atomizing the raw-material solution 14) in the solution vessel 15 (first vessel), and a step of obtaining the aiding-agent mist M2 by turning the reaction aiding solution 24 into a mist in the solution vessel 25 (second vessel) which is provided independently of the solution vessel 15.

Then, the raw-material solution mist M1 and the aiding-agent mist M2 are fed into the mixing vessel 8 via the paths L1 and L2 which are provided independently of each other. Thereafter, a step of obtaining the mixed mist M3 by mixing the raw-material solution mist M1 and the aiding-agent mist M2 in the mixing vessel 8 is performed. The mixed mist M3 is fed to the nozzle 12 in the reactor vessel 11 via a mist output port 83O (mixed-mist output port) and the path L3 (third path).

Then, the mixed mist M3 is fed front the nozzle 12 to a back surface of the P-type silicon substrate 4 which is being heated and is placed under an atmospheric pressure, in the reactor vessel 11. When the mixed mist M3 is sprayed to a back surface of the P-type silicon substrate 4 being heated, the back-side passivation film 5 composed of an aluminum oxide film is formed on a back surface of the P-type silicon substrate 4.

Thus, a film formation step of forming the back-side passivation film 5 on a back surface of the P-type silicon substrate 4 is performed in such a manner that the mixed mist M3 obtained in the mixing vessel 8 is fed onto a back surface (one main surface) of the P-type silicon substrate 4 via the nozzle 12 in the reactor vessel 11 while the P-type silicon substrate 4 is heated.

As described above, by feeding the mixed mist M3 resulting from mixture in the mixing vessel 8 into the reactor vessel 11 provided independently of the mixing vessel 8 at a time when a film formation step is performed, it is possible to increase a film formation speed of the back-side passivation film 5 and improve production efficiency.

Further, since the mixed mist M3 which is a mixture of the raw-material solution mist M1 and the aiding-agent mist M2 is obtained in the mixing vessel 8 at a time when a step of generating the mixed mist M3 is performed before a film formation step, the mixed mist M3 in a state in which the raw-material solution mist M1 and the aiding-agent mist M2 satisfactorily react with each other can be stably obtained. As a result of this, film quality of the back-side passivation film 5 which is formed in a film formation step can be improved.

Moreover, the raw-material solution mist M1 and the aiding-agent must M2 are obtained in the solution vessel 15 and the solution vessel 25, respectively, which are provided independently of each other, and the raw-material solution mist M1 and the aiding-agent mist M2 react with each other for the first time in the mixing vessel 8. Accordingly, a phenomenon occurring in the conventional film forming apparatus 200 shown in FIG. 7, in which the raw-material solution mist M1 (raw-material solution 18) and the aiding-agent mist M2 (reaction aiding solution 24) unnecessarily react with each other before a step of generating the mixed mist M3, is surely avoided, so that film quality of the back-side passivation film 5 can be kept high.

It is noted that also the film forming apparatus 102 of the second embodiment, like the film forming apparatus 101 of the first embodiment, may employ a configuration in which the ozone gas G9 is fed to the nozzle 12 and the ozone gas G9, in addition to the mixed mist M3, is fed onto a back surface of the P-type silicon substrate 4 from the nozzle 12.

(Structure of mixing vessel 8)

Figure 5A:
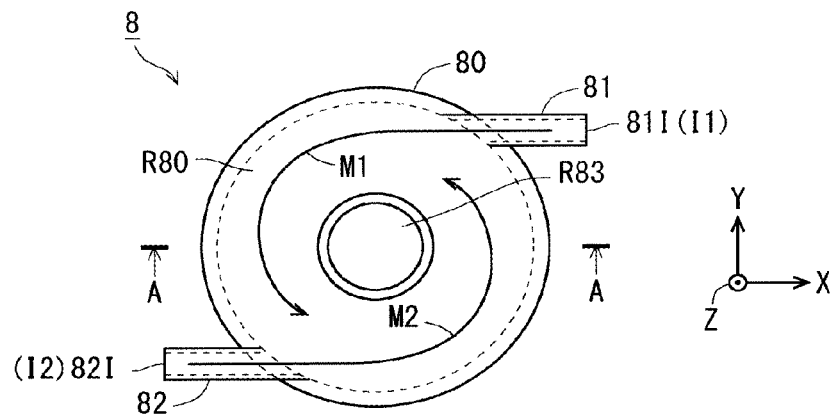
FIGS. 5A and 5B are explanatory views showing details of a structure of a mixing vessel shown in FIG. 4.
Figure 5B:
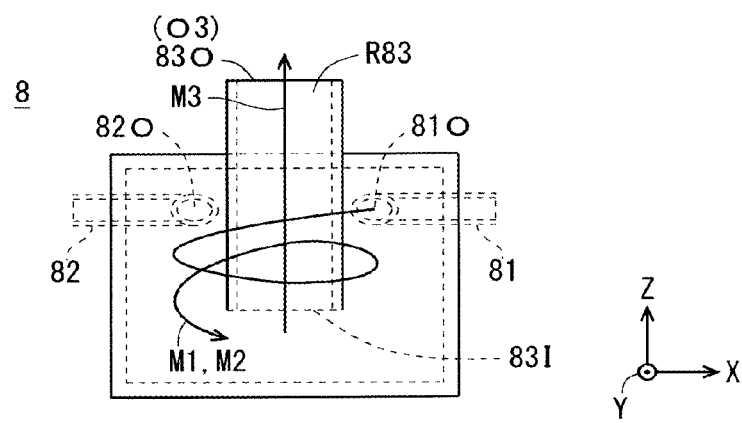

FIGS. 5A and 5B are explanatory views showing details of a structure of the mixing vessel 8 shown in FIG. 4, while FIG. 5A is a top view and FIG. 5B is a cross-sectional view taken along a line A-A in FIG. 5A. In each of FIGS. 5A and 5B, an X, Y, Z-rectangular coordinate system is shown.

As shown in FIGS. 5A and 5B. the mixing vessel 8 includes a vessel body 80, mist feeders 81 and 82 (first and second mist feeders), and a mist extraction unit 83.

The vessel body 80 has a cylindrical shape within which a space is formed. Each of an area inside a circular broken line in FIG. 5A and an area inside a rectangular broken line in FIG. 5B indicates a space formed within the vessel body 80.

On the other hand, the mist extraction unit 83 which is hollow and has a cylindrical shape is placed so as to be inserted into the vessel body 80 via an opening provided in an upper surface of the vessel body 80. In this regard, with the mist extraction unit 83 being inserted into the foregoing opening, a clearance between the mist extraction unit 83 and the vessel body 80 is sealed. Moreover, a hollow portion within the mist extraction unit 83 serves as an internal path R83.

The mist extraction unit 83 is inserted through an upper surface of the vessel body 80, and the mist output port 83O (corresponding to the output section O3 in FIG. 4) in an upper opening on an upper side (on a side in a +Z direction) is present outside the vessel body 80 while the mist input port 83I (a mixed-mist input port) in a lower opening on a lower side (on a side in a −Z direction) is present within the vessel body 80. The mist extraction unit 83 is placed at a predetermined height above a bottom surface of the vessel body 80. Also, as shown in FIG. 5A, the mist extraction unit 83 is provided in a central portion of the vessel body 80 in plan view.

The mist-extraction unit 83 configured in the above-described manner receives the mixed mist M3 obtained in the vessel body 80, from the mist input port 83I, allows the mixed mist M3 to pass through the internal path R83, and extracts the mixed mist M3 at the mist output port 83O (mixed-mist output port). The mixed mist M3 output from the mist output port 83O of the mist extraction unit 83 is fed into the reactor vessel 11 via the path L3.

Then, a space between an inner side surface (circular portion indicated by a broken line in FIGS. 5A and 5B) of the vessel body 80 and an outer side surface of the mist extraction unit 83 forms an outer path R80 (mixing path) having a shape of a circumference in plan view, as shown in FIG. 5A.

Also, the mist feeders 81 and 82 each including a hollow portion therein are provided in a side surface of the vessel body 80 so as to feed the raw-material solution mist M1 and the aiding-agent mist M2 along a tangent of an inner side surface of the vessel body 80. The mist input pons 81I and 82I (corresponding to the input sections I1 and I2 in FIG. 4) which are respective ends of the mist feeders 81 and 82 on an external side with respect to the vessel body 80 are connected to the paths L1 and L2.

More specifically, as shown in FIG. 5A, the mist feeder 81 is provided near an uppermost point (in a +Y direction) of the vessel body 80 in plan view so as to extend in parallel with an X direction, and the raw-material solution mist MI is fed along a −X direction (along a tangent near the foregoing uppermost point). Similarly, the mist feeder 82 is provided near a loweif lost point (in a −Y direction) of the vessel body 80 in plan view so as to extend in parallel with an X direction, and the aiding-agent mist M2 is fed along a +X direction (along a tangent of the foregoing lowermost point).

The mist feeders 81 and 82 are placed at the same height as formed (a height in a Z direction) in a side surface of the vessel body 80, and the mist input port 83I is placed at a height as formed, which is less than that of the mist feeders 81 and 82.

Because of the structure of the mixing vessel 8 shown in FIGS. 5A and 5B, the film formation method for the back-side passivation film 5 according to the second embodiment can produce the following effects.

In a stop of venerating the mixed mist M3 in the mixing vessel 8, the mixed mist M3 is obtained in such a manner that the raw-material solution mist M1 and the aiding-agent mist M2 are mixed with each other while being circulated in the outer path R80, so that the mixed mist M3 having a desired property can be obtained more surely than, in such a configuration, in which this mixed mist M3 is obtained in the nozzle 12 as described in the first embodiment.

In addition, there is created an elevation difference between the mist feeders 81 and 82 (first and second mist feeders) and the mist input port 83I (mixed-mist input post), so that the outer path R80 having a path length which is large enough to obtain the mixed mist M3 through mixture of the raw-material solution mist M1 and the aiding-agent mist M2, can be secured.

That is, in the outer path R80, it is possible to surely have a reaction time sufficient to obtain the mixed mist M3 having a desired property in the course during which the raw-material solution mist M1 and the aiding-agent mist M2 are going from the mist feeders 81 and 82 toward the mist input port 83I on a lower side.

In the meantime, though it is preferable that the mist feeders 81 and 82 have the same height as formed in a side surface of the vessel body 80, even if the mist feeders 81 and 82 are placed at different heights as formed, by securing a sufficient elevation difference between one of the mist feeders 81 and 82 which is lower and the mist input port 83I (an elevation difference which can ensure a reaction time sufficient to obtain the mixed mist M3), it is possible to attain the same effects.

Further, in the outer path R80 which is formed in a shape of a circumference in plan view by a space between an inner side surface of the vessel body 80 and an outer side surface of the mist extraction unit 83, the raw-material solution mist M1 and the aiding-agent mist M2 can be stirred while being rotated. In other words, the raw-material solution mist M1 and the aiding-agent mist M2 can be guided to the mist input port 83I on a lower side while being rotated counterclockwise in plan view and being stirred.

As a consequence, the mixed mist M3 in which the raw-material solution mist M1 and the aiding-agent mist M2 are efficiently mixed can be obtained in the outer path R80.

It is noted that in the second embodiment, a structure in which each of an inner side surface of the vessel body 80 and an outer side surface of the mist extraction unit 83 has a circular shape and the outer path R80 is provided in a shape of a circumference in plan view, is employed. In place of this structure, a structure in which each of an inner side surface of the vessel body 80 and an outer side surface of the mist extraction unit 83 has a shape of a polygon (preferably, a shape of a regular polygon) having five or more line segments and an outer path is provided along a polygon-shaped perimeter in plan view, may be employed, and such a structure can attain the same effects.

Further, the mist feeders 81 and 82 are provided in a side surface of the vessel body 80 so as to feed the raw-material solution mist M1 and the aiding-agent mist M2 along a tangent of an inner side surface of the vessel body 80.

Accordingly, the raw-material solution mist M1 and the aiding-agent mist M2 can he efficiently rotated from the beginning of feeding thereof from the mist feeders 81 and 82 into the outer path R80, so that the mixed mist MS in which the raw-material solution mist M1 and the aiding-agent mist M2 are more efficiently mixed can be obtained.

<Others>

It is noted that though the above-described embodiments describe, an example in which the back-side passivation film 3 is manufactured on a back surface of the P-type silicon substrate 4 in a manufacturing method for a solar cell, as a film formation method of forming a metal oxide film on one mam surface of a substrate, the above-described example does not pose any limitation, of course. For example, an insulating substrate such as a glass substrate may be used as a substrate other than the P-type silicon substrate 4, and a metal oxide film may be formed for a purpose other than the purpose of using it as a passivation film. In other words, the present invention is generally applicable to a metal oxide film formation method in which a metal oxide film is formed on one main surface of a substrate using a mist method, and produces effects of improving performance of a metal oxide film itself such as an aluminum oxide film.

Though the above-described embodiments describe aluminum as a metal source of the raw-material solution 14, any material solution in which metal salt, a metal complex, or a metal alkoxide compound is dissolved, may be used, and a metal, source included in the raw-material solution 14 can be arbitrarily selectable depending on each use of a metal oxide film winch is to be formed. As a metal source other than aluminum (Al), titanium (Ti), zing (Zn), indium (In), and tin (Sn) can be employed, or alternatively, at least one of the foregoing substances can be employed, for example.

Though the mist feeders 81 and 82 are provided for the raw-material solution mist M1 and the aiding-agent mist M2, respectively, a single common mist feeder which receives both of the raw-material solution mist M1 and the aiding-agent mist M2 in common and feeds the mists from the same position into the outer path R80, may be provided in place of the mist feeders 81 and 82.

While the invention has been shown and described in detail, the foregoing description is in all aspects illustrative and not restrictive. It is therefore understood that numerous modifications and variations can be devised without departing from the scope of the invention. In other words, in the present invention, respective embodiments can be freely combined, and each of the embodiments can be appropriately altered or omitted within the scope of the invention.

The invention claimed is:

1. A metal oxide film formation method, comprising:
   (a) turning a raw-material solution including a metallic element into a mist, to obtain a raw-material solution mist, in a first vessel;
   (b) turning a reaction aiding solution including a reaction aiding agent into a mist, to obtain an aiding-agent mist, in a second vessel provided independently of said first vessel, the reaction aiding agent aiding in an oxidation of said metallic element; and
   (c) feeding said raw-material solution mist and said aiding-agent mist via first and second paths provided independently of each other, into a reactor vessel while heating a substrate placed in said reactor vessel, to form a metal oxide film including said metallic element on one main surface of said substrate, wherein said reaction aiding solution is a solution including one of ammonia and a hydrochloric acid, and said raw-material solution mist and said aiding-agent mist are not mixed before reaching said reaction vessel, wherein said reactor vessel includes a nozzle, and said feeding (c) includes:
   (c-1) feeding said raw-material solution mist and said aiding-agent mist to said nozzle via said first and second paths;
   (c-2) mixing said raw-material solution mist and said aiding-agent mist in said nozzle, to obtain a mixed mist; and
   (c-3) feeding said mixed mist onto said one main surface of said substrate.

2. The method according to claim 1, wherein said metallic element is aluminum.

3. The method according to claim 2, wherein the metal oxide film is an aluminum oxide film.

* * * * *